（12）United States Patent
Andreola et al.

(10) Patent No.: US 12,255,088 B2
(45) Date of Patent: Mar. 18, 2025

(54) SUPPORT DEVICE FOR SUPPORTING A SUBSTRATE, METHOD OF PROCESSING A SUBSTRATE AND SEMICONDUCTOR SUBSTRATE

(71) Applicant: APPLIED MATERIALS ITALIA S.R.L., San Biagio di Callalta (IT)

(72) Inventors: Daniele Andreola, Povegliano (IT); Giorgio Cellere, Torri di Quartesolo (IT); Alvise Fecchio, San Biagio di Callalta (IT); Valentina Furin, Piazzola Sul Brenta (IT); Enrico Pasqualetto, Castelfranco Veneto (IT); Alessio Zanchettin, Revine Lago (IT); Marco Galiazzo, Quinto di Treviso (IT)

(73) Assignee: APPLIED MATERIALS ITALIA S.R.L., San Biagio di Callalta (IT)

( * ) Notice: Subject to any disclaimer, the term of this patent is extended or adjusted under 35 U.S.C. 154(b) by 291 days.

(21) Appl. No.: 17/793,344

(22) PCT Filed: Feb. 27, 2020

(86) PCT No.: PCT/EP2020/055177
§ 371 (c)(1),
(2) Date: Jul. 15, 2022

(87) PCT Pub. No.: WO2021/170240
PCT Pub. Date: Sep. 2, 2021

(65) Prior Publication Data
US 2023/0058931 A1    Feb. 23, 2023

(51) Int. Cl.
*H01L 21/683* (2006.01)
*B23K 26/38* (2014.01)
(Continued)

(52) U.S. Cl.
CPC .......... *H01L 21/6838* (2013.01); *B23K 26/38* (2013.01); *B25B 11/005* (2013.01);
(Continued)

(58) Field of Classification Search
CPC ............... H01L 21/6838; H01L 21/268; H01L 21/67092; H01L 21/67115; H01L 21/78; B23K 26/38; B25B 11/005
(Continued)

(56) References Cited

U.S. PATENT DOCUMENTS

| | | | |
|---|---|---|---|
| 6,446,948 B1 * | 9/2002 | Allen | B25B 11/005 269/21 |
| 7,992,877 B2 * | 8/2011 | Balan | H01L 21/6838 269/21 |

(Continued)

FOREIGN PATENT DOCUMENTS

| | | |
|---|---|---|
| EP | 0987739 A2 | 3/2000 |
| EP | 2704182 A1 | 3/2014 |

(Continued)

OTHER PUBLICATIONS

Japanese Office Action dated Apr. 5, 2024 for Application No. 2022-545856.

(Continued)

*Primary Examiner* — Vu A Vu
(74) *Attorney, Agent, or Firm* — Patterson + Sheridan, LLP (57) ABSTRACT

A support device includes a substrate receiving region. The support device includes a support body shaped as a pattern having an array of openings. The support body is a sparse structure wherein a joint area of the openings of the array of openings is 40% or more of the area of the substrate receiving region. The support body includes one or more (Continued)

suction openings configured to be in fluid communication with a vacuum source arrangement.

15 Claims, 9 Drawing Sheets

(51) Int. Cl.
  *B25B 11/00* (2006.01)
  *H01L 21/268* (2006.01)
  *H01L 21/67* (2006.01)
  *H01L 21/78* (2006.01)

(52) U.S. Cl.
  CPC ...... *H01L 21/268* (2013.01); *H01L 21/67092* (2013.01); *H01L 21/67115* (2013.01); *H01L 21/78* (2013.01)

(58) Field of Classification Search
  USPC .......................................................... 438/463
  See application file for complete search history.

(56) References Cited

U.S. PATENT DOCUMENTS

| | | | |
|---|---|---|---|
| 8,368,870 B2 * | 2/2013 | Shibuta | G03F 7/70341 355/72 |
| 8,801,418 B2 * | 8/2014 | El-Siblani | B33Y 10/00 425/375 |
| 9,233,455 B2 * | 1/2016 | Ooi | H01L 21/6838 |
| 10,053,777 B2 * | 8/2018 | Ranish | C23C 16/4585 |
| 2010/0067886 A1 * | 3/2010 | Liu | H01L 21/02345 392/416 |
| 2013/0037527 A1 * | 2/2013 | Franklin | B23K 26/40 269/21 |
| 2018/0095265 A1 * | 4/2018 | Chen | G02F 1/1333 |

FOREIGN PATENT DOCUMENTS

| | | |
|---|---|---|
| JP | H0949789 A | 2/1997 |
| JP | 2000216230 A | 8/2000 |
| JP | 2013-012581 A | 1/2013 |
| JP | 2016-025282 A | 2/2016 |
| JP | 2018006487 A | 1/2018 |
| JP | 2018113361 A | 7/2018 |
| TW | 201805987 A | 2/2018 |
| WO | 2004/025724 A1 | 3/2004 |
| WO | 2014/098771 A1 | 6/2014 |

OTHER PUBLICATIONS

Taiwan Office Action dated Jun. 20, 2022 for Application No. 110106992.
Japanese Office Action dated Oct. 17, 2023 for Application No. 2022-545856.
International Search Report and Written Opinion dated Nov. 9, 2020 for Application No. PCT/EP2020/055177.
Korean Notice of Allowance dated May 17, 2024 for Application No. 10-2022-7032034 (44017774KR01).

* cited by examiner

SUPPORT DEVICE FOR SUPPORTING A SUBSTRATE, METHOD OF PROCESSING A SUBSTRATE AND SEMICONDUCTOR SUBSTRATE

FIELD

Embodiments of the present disclosure relate to a support device for supporting a substrate, such a semiconductor wafer. More specifically, embodiments described herein relate to a support device for holding a substrate using a vacuum force. The substrate held by the support device can be subjected to processing, for example by a laser device.

BACKGROUND

In many applications, a substrate is placed on a substrate support such that the substrate can be processed. For example, a substrate support can be a horizontal support providing a horizontal surface on which the substrate is placed for allowing the substrate to be processed. A holding force can be applied to the substrate while the substrate is supported by the substrate support, so that the substrate is held securely in place. For example, a substrate support can function as a vacuum chuck or an electrostatic chuck which exerts a holding force on the substrate.

A substrate can be a thin piece of material, such as a semiconductor wafer. In some technologies, the thickness of substrates is ever decreasing. For example, thin semiconductor substrates having a thickness of 0.2 mm and even less are used and processed in current applications.

A substrate held by a substrate support can be processed by forming a pattern in the substrate, e.g. using a laser. The laser directs a laser beam onto the substrate. By moving the laser beam over the substrate, a pattern can be formed in the substrate. The pattern can include a plurality of openings or holes which are cut from or drilled into the substrate by the laser. Depending on the application, different kinds of patterns are formed in the substrate.

The demands for the high precision needed for forming a pattern in a substrate are ever-increasing. Small deviations of the position of the pattern from a pre-determined target position can compromise the performance of the final product. Accordingly, even very small movements of the substrate, such as very small translations of the substrate, during the processing should be avoided.

In light of the above, there is a need for an improved support device which ensures that a movement of the substrate during the processing thereof is avoided.

SUMMARY

According to an embodiment, a support device for supporting a substrate is provided. The support device includes a substrate receiving region. The support device includes a support body shaped as a pattern having an array of openings. The support body is a sparse structure wherein a joint area of the openings of the array of openings is 40% or more of the area of the substrate receiving region. The support body includes one or more suction openings configured to be in fluid communication with a vacuum source arrangement.

According to a further embodiment, a support device for supporting a substrate is provided. The support device includes a support body having an array of openings. The support body is a grid-shaped support body. The array of openings is a two-dimensional array of openings. The support body includes one or more suction openings in the support body.

According to a further embodiment, an apparatus for processing a substrate is provided. The apparatus includes a support device as described herein. The apparatus includes a processing device for forming a plurality of openings in a substrate supported by the support body of the support device.

According to a further embodiment, a method of processing a substrate is provided. The method includes supporting a substrate by a support body, wherein a plurality of portions of the substrate having a joint area of 40% or more of the area of the substrate are unsupported. The method includes suctioning the substrate to the support body at one or more suction openings.

According to a further embodiment, a semiconductor substrate is provided. The semiconductor substrate includes a two-dimensional array of openings, wherein a joint area of the openings of the two-dimensional array of openings is 40% or more of the area of the semiconductor substrate.

Embodiments are also directed at apparatuses for carrying out the disclosed methods and include apparatus parts for performing each described method aspect. These method aspects may be performed by way of hardware components, a computer programmed by appropriate software, by any combination of the two or in any other manner. Furthermore, embodiments according to the disclosure are also directed at methods for operating the described apparatus. The methods for operating the described apparatus include method aspects for carrying out every function of the apparatus.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following.

DETAILED DESCRIPTION

Reference will now be made in detail to the various embodiments of the disclosure, one or more examples of which are illustrated in the figures. Within the following description of the drawings, the same reference numbers refer to same components. Generally, only the differences with respect to individual embodiments are described. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

Embodiments described herein relate to a support device for supporting a substrate. The support device may be configured for supporting the substrate in a horizontal direction. The support device holds the substrate in place by applying an under-pressure or negative pressure to a bottom surface of the substrate. While the substrate is held by the support device, the substrate can be processed.

The support device as described herein can be understood as a stationary support device configured for holding the substrate in a stationary or fixed position. A stationary support device is distinguished from a dynamical support device such as, for example, a conveyor belt, which transports the substrate while supporting the substrate.

A substrate, as described herein, can be understood as a substantially flat piece of material. The substrate can be a wafer. The substrate can be a semiconductor substrate or semiconductor wafer, particularly a silicon substrate or silicon wafer. For example, the substrate can be a c-Si wafer. The substrate can be a substantially rectangular substrate. The term "substantially rectangular" includes, for example, substrates which have rounded corners but which otherwise have a rectangular shape ("pseudo-square" substrates). A substrate as described herein can be a substrate for use in a printed circuit board (PCB) application. A substrate can have a length of 20 cm or less in a first direction and/or have a length of 20 cm or less in a second direction.

The substrate, such as a silicon substrate, can be a thin piece of material. The substrate can have a thickness of 150 μm or less, such as 120 μm or less or even 110 μm or less.

A support device according to embodiments described herein is used for holding a substrate, such as a thin silicon substrate, in a fixed position for allowing the substrate to be processed. The substrate held by the support device can be processed by a processing device as described herein, such as a laser device. Using the processing device, a plurality of openings, i.e. through-holes, can be formed, such as cut or drilled, in the substrate. The processing device can be used to cut pieces, e.g. rectangular shaped pieces, out of the substrate so that a plurality of openings can be formed in the substrate. For example, FIG. 6 shows a substrate 600 in which a plurality of openings have been formed by a processing device.

Figure 6:
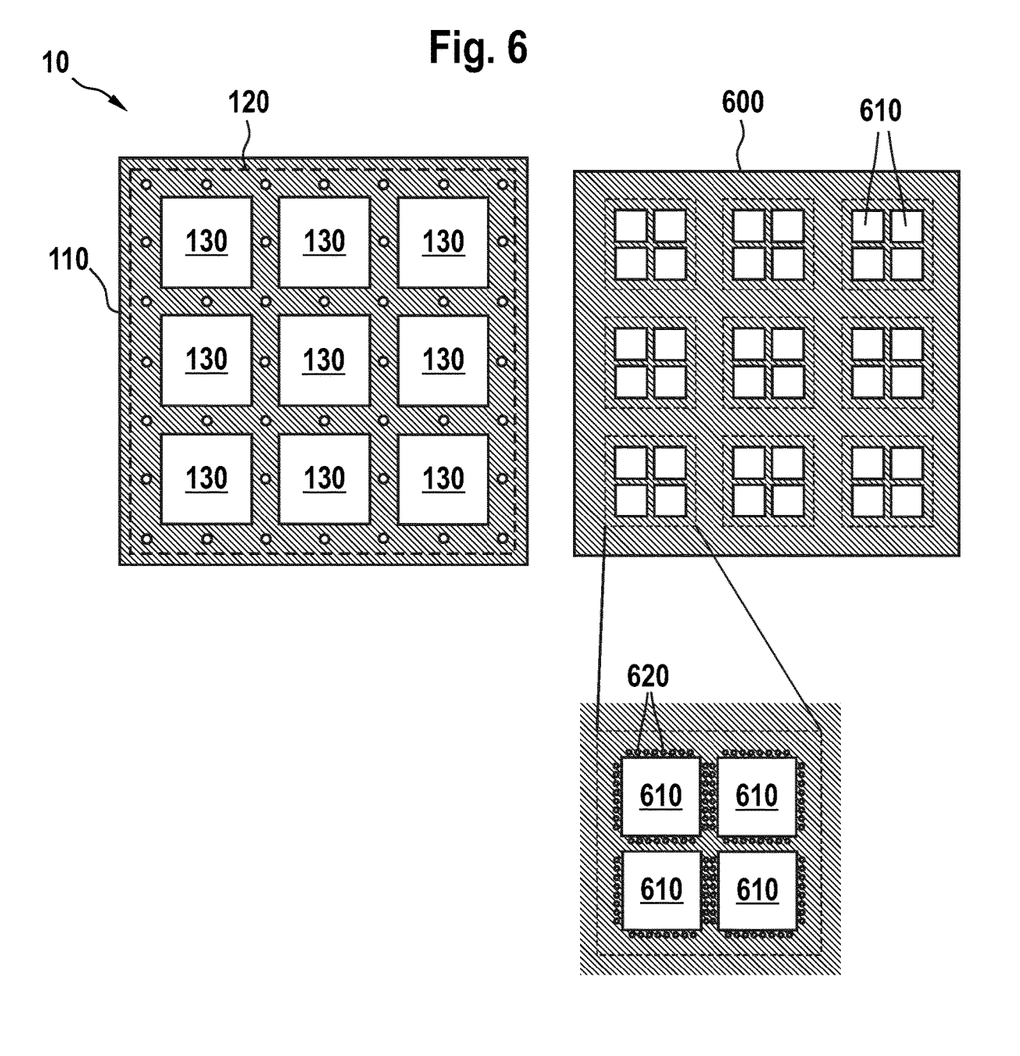
FIG. 6 shows a support device according to embodiments described herein and a substrate configured to be supported by the support device, wherein the substrate has a plurality of openings formed therein, wherein the openings have been formed while the substrate was supported by the support device.

Some of the openings formed in the substrate can be relatively large openings, e.g. large openings 610 shown in FIG. 6, having a length and/or width which can be 5% or more of the length and/or width, respectively, of the substrate.

Additionally or alternatively, relatively small openings can be formed, e.g. drilled, in the substrate by the processing device. For example, as shown in FIG. 6, the processing device can form small openings 620, such as vias, in the substrate 600 such that each large opening 610 is surrounded by a plurality of small openings 620.

In some implementations, different from FIG. 6, small openings only can be formed in the substrate, i.e. no large openings. In yet further implementations, large openings only can be formed in the substrate.

The pattern according to which the openings, i.e. the small openings and/or the large openings, are formed in the substrate can involve a variety of possible patterns, depending on the application for which the substrate will be used. In some implementations, the openings in the substrate may be distributed across substantially the whole surface of the substrate.

In some implementations, the total area, or joint area, of the material which is removed from the substrate to form the openings in the substrate can be large. The total area of material which is removed from the substrate, i.e. the total area of the openings formed in the substrate while the substrate is supported by the support device, can be 40% or more, 50% or more or 60% or more of the area of the substrate. A support device according to embodiments described herein is a sparse structure which allows for such a large amount of material to be removed from the substrate, while ensuring that the substrate is held securely in place throughout the cutting or drilling process. A displacement of the substrate or vibrations of the substrate during the cutting or drilling process can be reduced or even avoided. In light thereof, the openings can be formed in the substrate with high precision.

When a large amount of material is removed from the substrate, as described herein, then the substrate can become fragile in light of the plurality of openings which are formed in the substrate. For example, thin portions of the substrate in between adjacent openings 610 can move, e.g. vibrate, easily. If such portions are not firmly held in place, vibrations of such portions can lead to inaccuracies in the position of subsequent holes which are drilled in the substrate, or can even cause such thin portions of the substrate to break. Embodiments described herein allow to securely hold the substrate in place by applying a holding force to the substrate at a plurality of locations which are distributed over the full area of the substrate. A displacement of the substrate or vibrations of the substrate during the cutting process can be reduced or even avoided.

In further implementations, complex patterns of openings can be formed in the substrate. The specific pattern to be formed in the substrate can depend on the application for which the substrate is to be used. A further advantage of a support device according to embodiments described herein is that the support device is a sparse structure wherein the contact area between the substrate and the support device is small, so that a large portion of the substrate is available for forming openings therein, i.e. large openings and/or small openings, in a variety of possible patterns of the openings.

Figure 1:
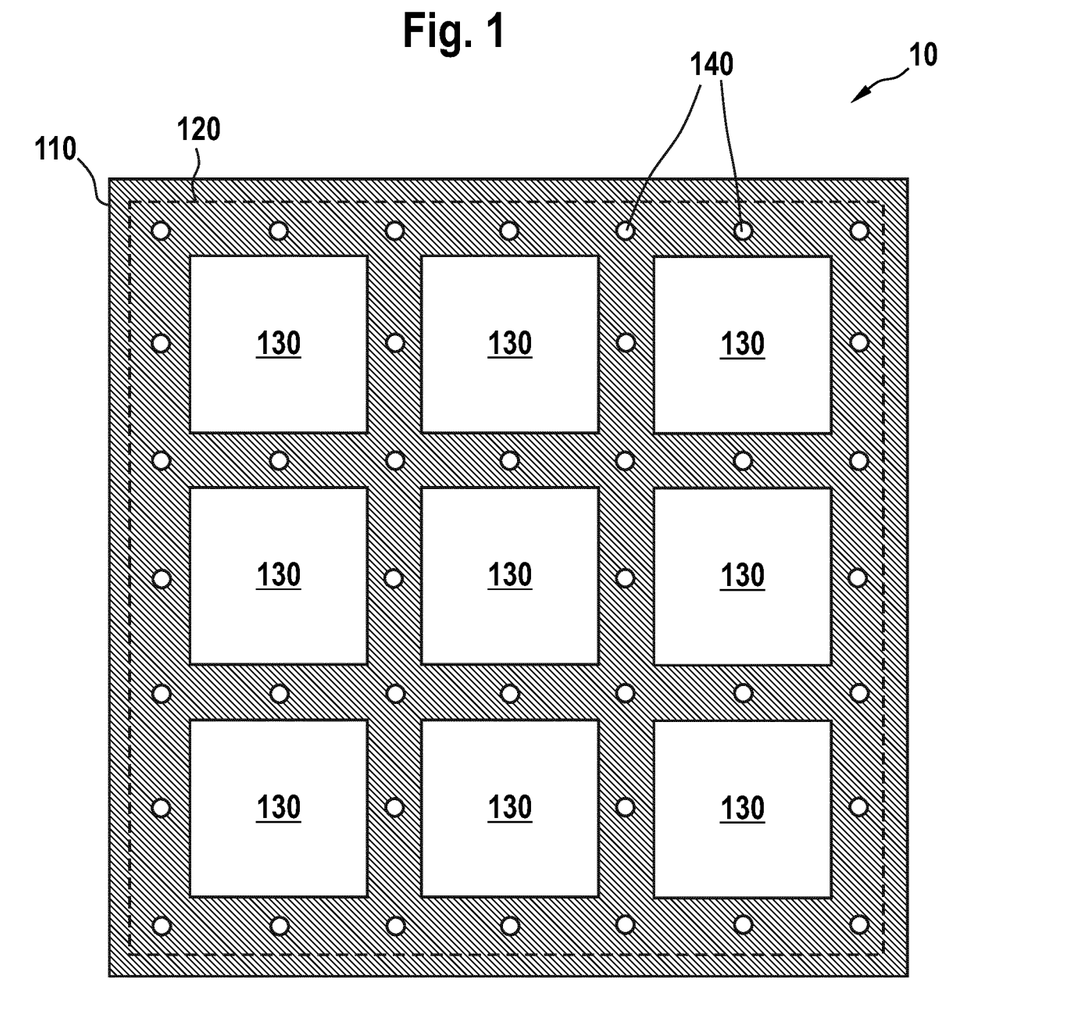
FIGS. 1-5 show exemplary designs of a support device for supporting a substrate according to embodiments described herein.

FIG. 1 shows a top view of a support device 10 according to embodiments described herein.

According to an embodiment, a support device 10 for supporting a substrate is provided. The support device 10 includes a substrate receiving region. For example, FIG. 1 shows a substrate receiving region as the region defined by the dashed lines 120. The support device 10 includes a support body 110 shaped as a pattern having an array of openings 130. The support body 110 is a sparse structure wherein a joint area of the openings of the array of openings 130 is 40% or more of the area of the substrate receiving region. The support body 110 includes one or more suction openings 140 configured to be in fluid communication with a vacuum source arrangement.

A support device 10 as described herein can be understood as a vacuum chuck device. The support device 10 may be configured for holding the substrate by suctioning the substrate against the support body 110 at the one or more suction openings 140. A suction force for holding the substrate may be provided by applying a negative pressure at the one or more suction openings 140 using a vacuum source arrangement.

A substrate receiving region, as described herein, can be understood as a region of the support device 10 configured for receiving a substrate. The substrate receiving region may be a substantially rectangular region.

The substrate receiving region may have a first edge. The substrate receiving region may have a second edge. The second edge may be opposite the first edge. The first edge and the second edge may extend in a first direction, e.g. the left-right direction in FIG. 1. The substrate receiving region may have a third edge. The substrate receiving region may have a fourth edge. The fourth edge may be opposite the third edge. The third edge and the fourth edge may extend substantially in a second direction, e.g. the up-down direction in FIG. 1. The first edge of the substrate receiving region may be adjacent to, aligned with or substantially coinciding with, a first edge of the support body 110 of the support device 10. The second edge of the substrate receiving region may be adjacent to, aligned with or substantially coinciding with, a second edge of the support body 110 of the support device 10. The third edge of the substrate receiving region may be adjacent to, aligned with or substantially coinciding with, a third edge of the support body 110 of the support device 10. The fourth edge of the substrate receiving region may be adjacent to, aligned with or substantially coinciding with, a fourth edge of the support body 110 of the support device 10.

The support body 110 may have a periphery. The periphery of the support body 110 may define the extent of the support body 110. The substrate receiving region may be inside, or surrounded by, the periphery of the support body 110.

The array of openings 130 may be inside the substrate receiving region, as shown for example in FIG. 1. The substrate receiving region may have a periphery, e.g. dashed lines 120 shown in FIG. 1, surrounding the array of openings 130.

Each opening of the array of openings 130 may be a through-hole. The support body 110 may have a first face and a second face. The support body 110 may be configured for supporting a substrate at the first face. The second face may be opposite the first face. Each opening 130 of the array of openings 130 may extend through the support body 110 from the first face to the second face.

According to embodiments described herein, the support body 110 of the support device 10 is a sparse structure. That the support body 110 is a sparse structure may be understood in the sense that the support body 110 is formed of relatively thin pieces of material with relatively large openings 130, e.g. shaped in the form of windows, in between. The joint area taken up by all the openings of the array of openings 130 taken together is a relatively large part of the substrate receiving region. The joint area of the openings of the array of openings 130 may be 40% or more, particularly 50% or more, 60% or more, 70% or more or even 80% or more of the area of the substrate receiving region. The joint area, or total area, of the openings 130 can be understood as the sum of the areas of the individual openings 130. For example, if the array of openings 130 has N openings in total, the joint area of the openings 130 can be understood as the sum of the individual areas of the N openings 130.

Each opening of the array of openings 130 may correspond to an unsupported portion of the substrate. At each opening of the array of openings 130, the substrate may be unsupported by the support body 110. The support body 110 may be shaped such that a substrate supported by the support body 110 has a plurality of unsupported portions, wherein each unsupported portion of the plurality of unsupported portions faces an opening of the array of openings 130. The plurality of unsupported portions may not be supported or contacted by the support body 110.

The joint area of the openings of the array of openings 130, as described herein, can be understood as a joint area of a plurality of portions of the substrate which are unsupported by the support device 10.

In light of the large joint area of the openings of the array of openings 130, namely a joint area which can be 40% or more of the area of the substrate receiving region, a contact area between the support body 110 and a substrate supported in the substrate region by the support body 110 may be small compared to the area of the substrate receiving region. A contact area between the support body 110 and a substrate supported in the substrate region by the support body 110 may be 60% or less, particularly 50% or less, 40% or less 30% or less or even 20% or less, of the area of the substrate receiving region.

The unsupported portions of the substrate may be understood as portions of the substrate which are available for being processed by a laser for forming openings in said portions. In an unsupported portion of the substrate, an opening can be formed by the laser. The laser can pass through the substrate in the unsupported portion without impinging on the support body 110. In comparison, a portion of the substrate which is supported by the support body may not be available for being processed by the laser. At the supported portion, the laser would impinge on the support body and cause damage thereto. When the joint area of the openings of the array of openings 130 is high, such as 40% or more, 50% or more, 60% or more, 70% or more or even 80% or more of the area of the substrate receiving region, a large part of the substrate is available for forming openings therein in various sizes, shapes and patterns. A support device according to embodiments described herein provides for a large degree of flexibility for forming large and/or small openings in the substrate in various possible patterns.

The openings of the array of openings 130 may be relatively large openings. Each opening 130 of the array of openings 130 may have a first width in a first direction. The first width may be 5% or more of a first width of the substrate receiving region in the first direction. For example, the first direction may be the left-right direction in FIG. 1. Additionally or alternatively, each opening 130 of the array of openings 130 may have a second width in a second direction. The second width may be 5% or more of a second width of the substrate receiving region in the second direction. For example, the second direction may be the up-down direction in FIG. 1. In light thereof, a substrate supported by the support body 110 may have a plurality of unsupported portions. Each unsupported portion may have a relatively large size, i.e. a size being a relatively large fraction of the size of the substrate. Each unsupported portion may have a first width in the first direction. The first width may be 5% or more of the first width of the substrate receiving region in the first direction. Additionally or alternatively, each unsupported portion may have a second width in the second direction. The second width may be 5% or more of a second width of the substrate receiving region in the second direction.

A suction opening, as described herein, can be understood as an opening in the support body 110 connected or connectable to a vacuum source arrangement for suctioning or pulling the substrate against the support body 110 at the suction opening. Each suction opening of the one or more suction openings 140 can be disposed inside a periphery of the substrate receiving region, e.g. inside the dashed lines 120 shown in FIG. 1. The substrate can be supported by, held by or chucked to the support body 110 at each suction opening of the one or more suction openings 140. According to embodiments described herein, the suction openings are distributed over the substrate receiving region. In light thereof, the substrate can be suctioned against the support body 110 at a plurality of positions.

The suction openings shown in the figures are schematically depicted as circular openings. The present disclosure shall not be limited thereto. A suction opening can have other shapes, such as, for example, a thin, slit-like opening. In some implementations, several (e.g. circular) suction openings can be disposed next to each other as a linear sequence of a certain length. In other implementations, an elongated, slit-like suction opening of a certain length can be provided.

The support body 110 may include a plurality of channels. Each channel of the plurality of channels may end at a suction opening of the one or more suction openings 140. Each channel, or at least a portion thereof, may be disposed in an interior of the support body 110. Each suction opening of the one or more suction openings 140 may be configured to be in fluid communication with a vacuum source arrangement via one or more channels of the plurality of channels.

FIG. 1 shows an example of a substrate receiving area (dashed lines 120) which is smaller than, i.e. contained within, the outer perimeter of the support body 110. This is an example and shall not be construed as limiting. Other configurations are possible. For example, FIG. 10 discussed below shows a substrate 600 having an area which is larger than the area of the support body, i.e. the substrate extends beyond the borders of the support body. In such case, the substrate receiving area may be understood as coinciding with the area of the support body 110.

Figure 2:
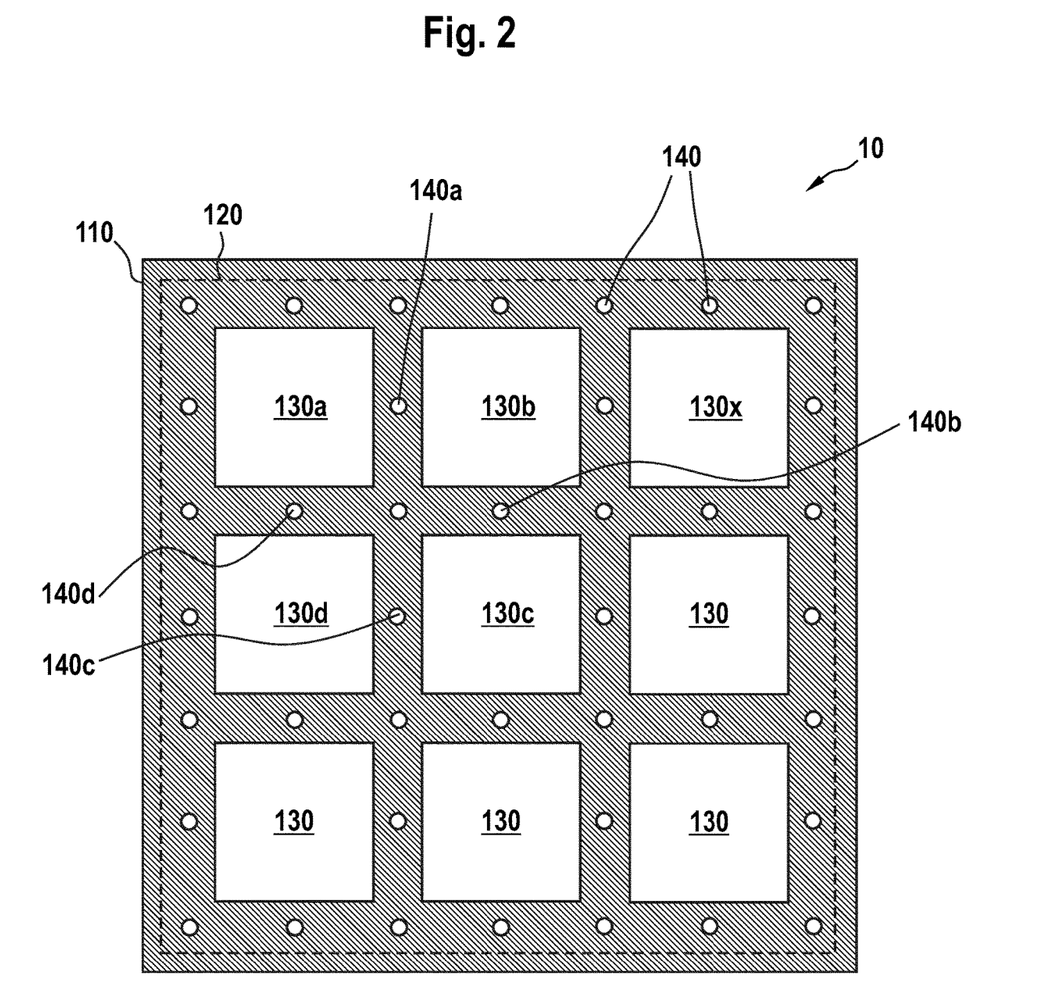

FIG. 2 shows a top view of a support device 10 according to embodiments described herein.

The array of openings of the support body 110, as described herein, may include a first opening, e.g. opening 130a shown in FIG. 2, and a second opening, e.g. opening 130b shown in FIG. 2. The one or more suction openings of the support body 110 may include at least one suction opening, e.g. suction opening 140a shown in FIG. 2, in a portion of the support body 110 between the first opening and the second opening. The first opening and the second opening may be adjacent openings of the array of openings. The one or more suction openings may be a plurality of suction openings. The plurality of suction openings may include two or more suction openings in a portion of the support body 110 between the first opening and the second opening.

Two openings of the array of openings can be understood as being adjacent openings if there is no third opening of the array of openings 130 in between the two openings. For example, the opening 130a and the opening 130b shown in FIG. 2 are adjacent openings of the array of openings. The opening 130a and the opening 130x are not adjacent openings of the array of openings.

Providing at least one suction opening between the first opening and the second opening of the array of openings allows the substrate 600 to be suctioned against the support body 110 at said at least one suction opening. While pieces of the substrate 600 disposed within the perimeter of the first opening and/or within the perimeter of the second opening are being cut from the substrate 600, e.g. by a processing device 710 as described herein, the substrate 600 can be securely held at the at least one suction opening between the first opening and the second opening. A displacement and/or vibration of the substrate 600 during the cutting operation can be avoided. Openings can be formed in the substrate 600 with high precision.

The array of openings 130 may include a first opening, for example opening 130a in FIG. 2. The array of openings 130 may include a second opening e.g. opening 130b in FIG. 2. The second opening may be adjacent to the first opening. The array of openings 130 may include a third opening, e.g. opening 130c in FIG. 2. The third opening may be adjacent to the second opening. The array of openings 130 may include a fourth opening, e.g. opening 130d in FIG. 2. The fourth opening may be adjacent to the third opening and to the first opening.

The first opening, the second opening, the third opening and the fourth opening may form a two-dimensional matrix of openings, particularly a 2×2 matrix, as shown for example in FIG. 2.

The one or more suction openings 140 may include at least one suction opening, e.g. suction opening 140a shown in FIG. 2, in a portion of the support body 110 between the first opening and the second opening. Additionally or alternatively, the one or more suction openings 140 may include at least one suction opening, e.g. suction opening 140b shown in FIG. 2, in a portion of the support body 110 between the second opening and the third opening. Additionally or alternatively, the one or more suction openings 140 may include at least one suction opening, e.g. suction opening 140c shown in FIG. 2, in a portion of the support body 110 between the third opening and the fourth opening. Additionally or alternatively, the one or more suction openings 140 may include at least one suction opening, e.g. suction opening 140d shown in FIG. 2, in a portion of the support body 110 between the fourth opening and the first opening.

At least one suction opening, or two or more suction openings, of the one or more suction openings 140 may be provided in the support body 110 between any two adjacent openings of the array of openings 130. For example, the support device 10 shown in FIG. 2 has a respective suction opening between any pair of adjacent openings of the array of openings 130. While pieces of the substrate 600 disposed inside the perimeter of the openings 130 are cut from the substrate 600, the substrate 600 can be securely held at the respective suction openings between adjacent openings 130. A displacement and/or vibration of the substrate 600 during the cutting operation can be avoided. Openings can be formed in the substrate 600 with high precision.

One or more, particularly two or more, openings of the array of openings 130 may each be surrounded by a number of suction openings of the one or more suction openings. Each opening of the array of openings 130 may be surrounded by a number of suction openings of the one or more suction openings.

Where an opening 130 of the array of openings 130 is surrounded by a number of suction openings, four, six, eight or more suction openings 140 may surround the opening 130. The suction openings surrounding the opening 130 may be disposed between the opening 130 and other openings of the array of openings 130 adjacent thereto. For example, in FIG. 2, eight suction openings surround each opening 130.

By surrounding an opening 130 of the array of openings 130 with a number of suction openings, the substrate 600 can be securely held in the region surrounding the opening 130. While one or more pieces of the substrate 600 disposed are cut from the substrate 600 within the perimeter of the opening 130, the substrate can be suctioned against the support body 110 at the suction openings surrounding the opening 130. A displacement and/or vibration of the substrate 600 during the cutting operation can be avoided in the region surrounding the opening 130. Openings can be formed in the substrate 600 with high precision.

The support body 110 may include a frame portion surrounding the array of openings 130. The frame portion may be configured for supporting the substrate 600 in the substrate receiving region. For example, with respect to FIG. 2, the frame portion may be understood as the portion of the support body surrounding the nine white rectangles, i.e. the nine openings of the array of openings 130.

The one or more suction openings 140 may include one or more, particularly a plurality of, outer suction openings provided in the frame portion. The one or more outer suction openings may surround the array of openings 130. The plurality of outer suction openings may include 10, 20 or more suction openings. For example, with respect to FIG. 2, the outer suction openings can be understood as the 24 openings surrounding the nine openings of the array of openings 130.

The array of openings of the support body 110 may include a first opening, e.g. opening 130*a*, and a second opening, e.g. opening 130*b*, as described herein. The first opening may be adjacent to the second opening. The support body 110 may include a support portion between the first opening and the second opening. The support portion may be configured for supporting, particularly contacting, the substrate 600.

The array of openings 130 may include a third opening, e.g. opening 130*c*, and a fourth opening, e.g. opening 130*d*, as described herein. The second opening may be adjacent to the third opening. The third opening may be adjacent to the fourth opening. The fourth opening may be adjacent to the first opening. The support body 110 may include a support portion between the second opening and the third opening. The support portion may be configured for supporting, particularly contacting, the substrate 600. The support body 110 may include a support portion between the third opening and the fourth opening. The support portion may be configured for supporting, particularly contacting, the substrate 600. The support body 110 may include a support portion between the fourth opening and the first opening. The support portion may be configured for supporting, particularly contacting, the substrate 600.

The support body 110 may include a support portion between any two adjacent openings of the array of openings 130. Each support portion between two adjacent openings may be configured for supporting, particularly contacting, the substrate 600.

The array of openings 130 may extend in a first direction (e.g. the left-right direction in FIG. 2) and in a second direction (e.g. the up-down direction in FIG. 2).

The array of openings 130 may be a two-dimensional array of openings. A two-dimensional array of openings can be understood as a matrix of openings.

The array of openings 130 may include a plurality of rows of openings, each row extending in the first direction. Each row of openings may include a number of openings. Each row of openings may extend in the first direction from a first opening of the row to a last opening of the row. Each row in the first direction may include 3 or more, particularly 5 or more, more particularly 10 or more, openings.

The array of openings 130 may include a plurality of rows of openings, each row extending in the second direction. Each row of openings may include a number of openings. Each row of openings may extend in the second direction from a first opening of the row to a last opening of the row. Each row in the second direction may include 3 or more, particularly 5 or more, more particularly 10 or more, openings.

The support body 110 may be shaped as a grid. The support body 110 may include a first plurality of elongated support portions each extending from a first side of the support body 110 to a second side of the support body 110 opposite the first side. For example, in FIG. 2, the first plurality of elongated support portions can be understood as the four strip-like portions extending between the left edge and the right edge of the support body 110. The support body 110 may include a second plurality of elongated support portions each extending from a third side of the support body to a fourth side of the support body opposite the third side. For example, in FIG. 2, the second plurality of elongated support portions can be understood as the four strip-like portions extending between the upper edge and the lower edge of the support body 110. The elongated support portions of the first plurality of elongated support portions may extend in a first direction, e.g. the left-right direction in FIG. 2. The elongated support portions of the second plurality of elongated support portions may extend in a second direction, e.g. the up-down direction in FIG. 2.

Adjacent openings of the array of openings 130 may be separated from each other by an elongated support portion of the first plurality of elongated support portions and/or by an elongated support portion of the second plurality of elongated support portions.

Each opening 130 of the array of openings 130 may be disposed between two elongated support portions of the first plurality of elongated support portions. The opening 130 may extend from one elongated support portion of the two elongated support portions to the other elongated support portion of the two elongated support portions.

Additionally or alternatively, each opening 130 of the array of openings 130 may be disposed between two elongated support portions of the second plurality of elongated support portions. The opening may extend from one elongated support portion of the two elongated support portions to the other elongated support portion of the two elongated support portions.

Figure 3:
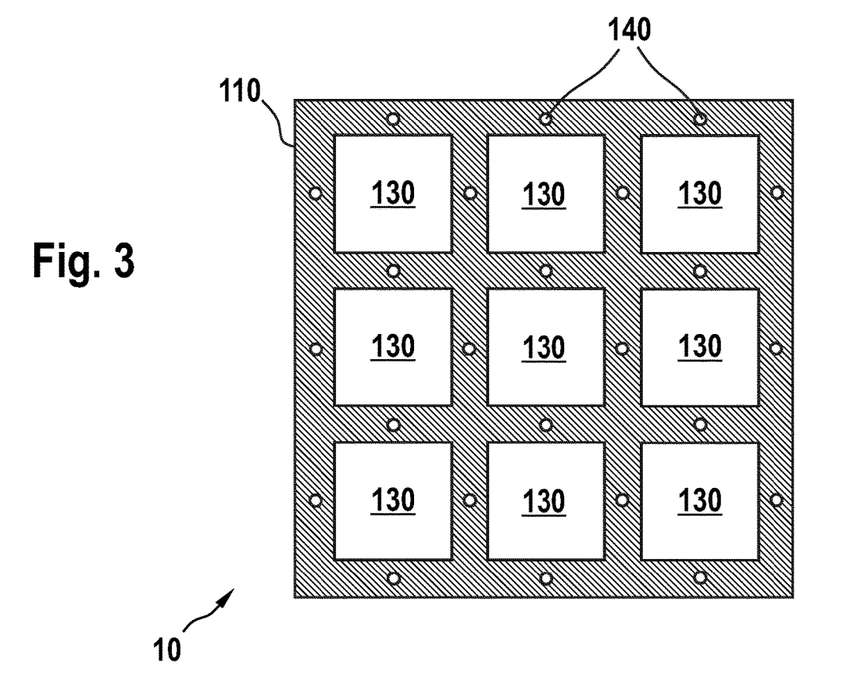
Figure 4:
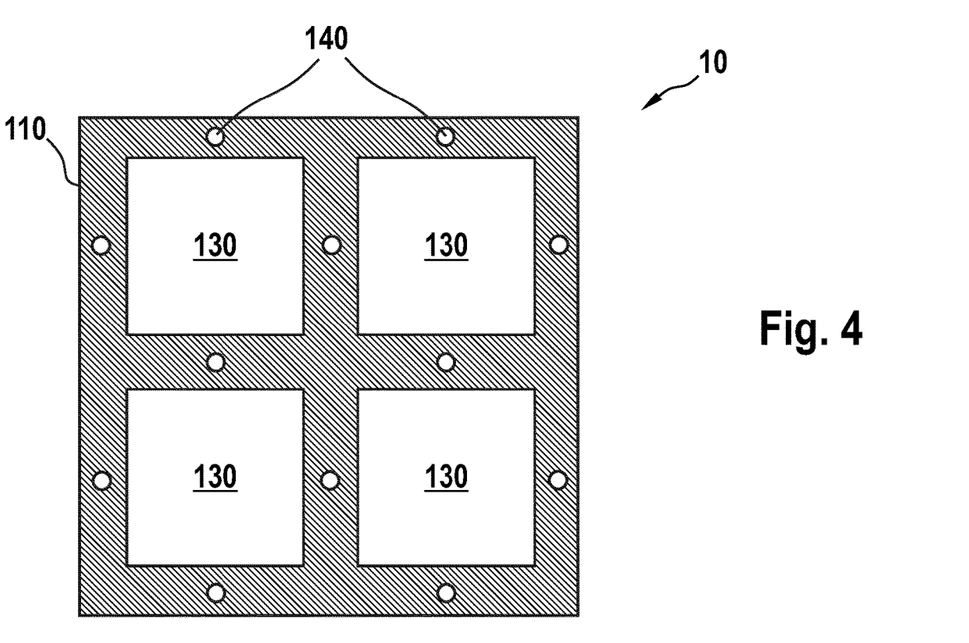
Figure 5:
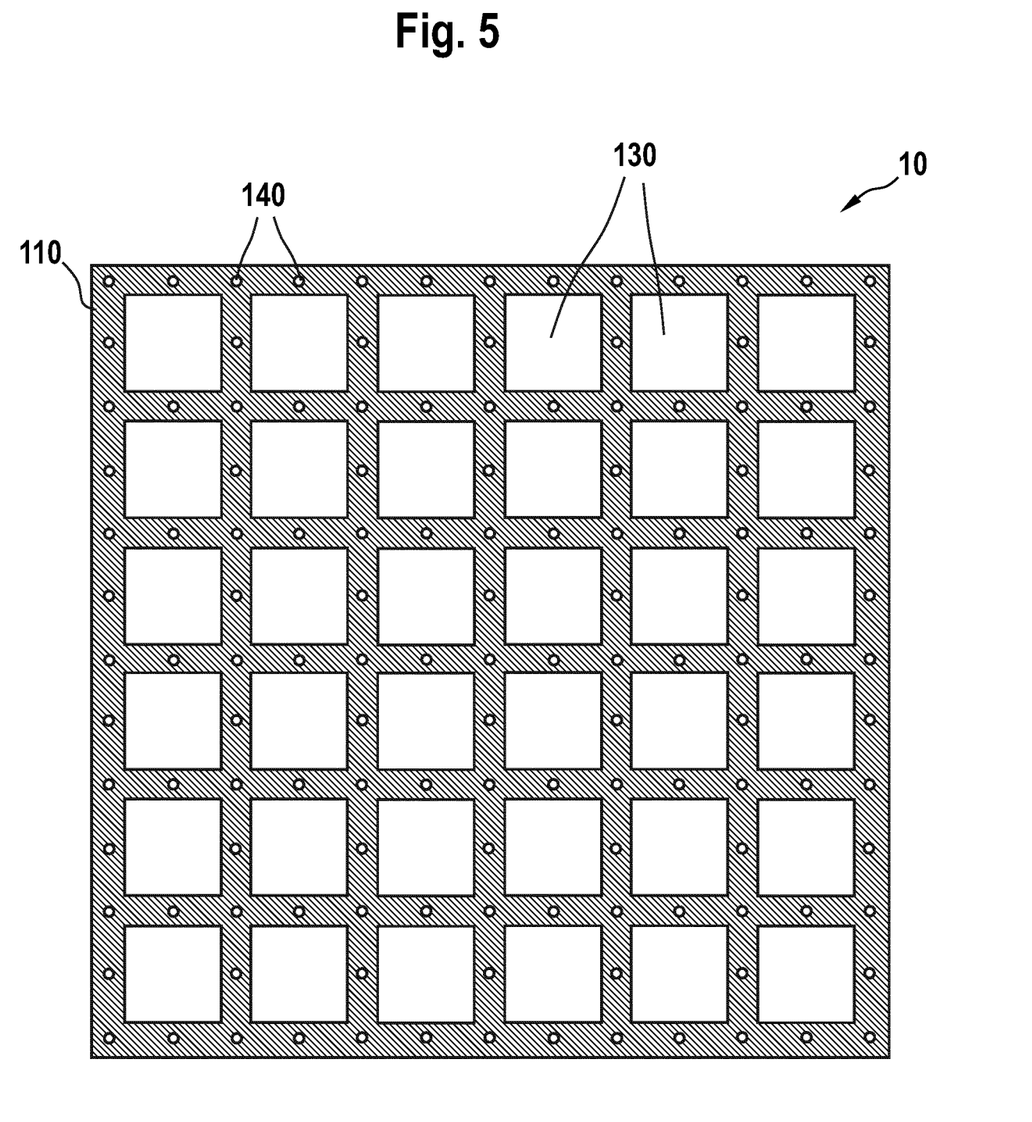

FIGS. 3, 4 and 5 show support devices 10 according to embodiments described herein.

The array of openings 130 may include 4 or more, 9 or more, 16 or more, or 25 or more openings.

The exemplary support bodies shown schematically in the figures have a square design having $N^2$ openings 130 arranged in an N×N matrix, with all openings 130 having the same size. Embodiments described herein are not limited to such a symmetric design. For example, different openings 130 of the array of openings 130 can have different sizes, the openings 130 can have shapes different from squares, the support body 110 need not have a square shape, and so on.

FIG. 6 shows a support device 10 according to embodiments described herein. FIG. 6 further shows a substrate 600 configured for being supported by the support body 110 shown in FIG. 6. The substrate 600 is configured for being received in the substrate receiving area. The size of the substrate receiving area, indicated by the dashed lines 120, matches the size of the substrate 600.

A substrate 600, as described herein, can include a plurality of large openings 610 and a plurality of small openings 620 or vias. The large openings 610 and the small openings 620 can be formed in the substrate 600 by a processing device while the substrate 600 is supported in the substrate receiving area by the support device 10. The location of the array of openings 130 is indicated with dashed lines on the substrate 600 to illustrate that each large opening 610 and each small opening 620 formed in the substrate 600 is inside the periphery of an opening of the array of openings 130. For example, as shown in FIG. 6, several large openings 610, such as four large openings, can be formed within the perimeter of one single opening 130 of the array of openings 130. Each large opening 610 can be surrounded by a number of small openings 620, such as 20 or more, 50 or more or 100 or more small openings. Each small opening 620 is formed inside the periphery of an opening 130 of the array of openings 130.

According to a further embodiment, a support device 10 for supporting a substrate 600 is provided. The support device 10 includes a support body 110 having an array of openings 130. The support body 110 is a grid-shaped support body. The array of openings 130 is a two-dimensional array of openings. The support body 110 includes one or more suction openings 140 in the support body 110. The support device 10 can include all components, features and aspects of a support device as described herein.

Figure 7:
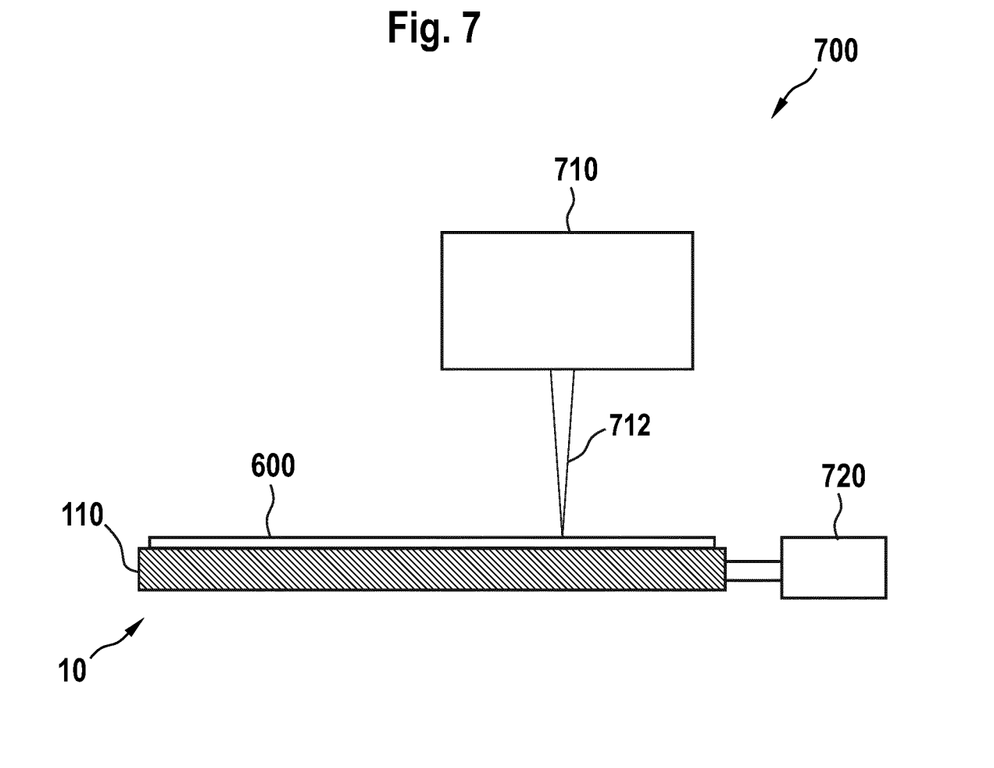
FIGS. 7, 8*a-b* and 9*a-b* show an apparatus according to embodiments described herein, the apparatus including a support device and a processing device.

FIG. 7 shows a side view of an apparatus 700 for processing a substrate 600 according to embodiments described herein.

According to a further embodiment, an apparatus 700 for processing a substrate 600 is provided. The apparatus 700 includes a support device 10 as described herein. The apparatus 700 includes a processing device 710 for forming, e.g. cutting or drilling, a plurality of openings in a substrate 600 supported by the support body 110 of the support device 10.

A processing device 710 as described herein may be a laser device. The processing device 710 may be configured for directing a laser beam 712 onto a substrate 600 held by the support body 110 in the substrate receiving region. The processing device 710 may be configured for moving the laser beam relative to the substrate 600 to cut an opening, e.g. a rectangular opening such as a large opening 610 shown in FIG. 6, in the substrate 600. The processing device 710 may be configured for forming, particularly drilling, a small opening or via in the substrate, such as small opening 620 shown in FIG. 6.

A substrate 600 supported by the support body 110 may be processed by the processing device 710. A first portion of the substrate 600, e.g. a rectangular portion, may be disposed over, or may face, an opening 130 of the array of openings 130. The first portion may be an unsupported portion of the substrate 600. The first portion may have an area which is encompassed by, i.e. fits inside, the perimeter of the opening 130. For example, but without limiting the scope, the first portion of the substrate 600 may be shaped as a first rectangle and the opening 130 may be shaped as a second rectangle, wherein the first rectangle fits entirely within the second rectangle. The processing device 710 may cut the substrate 600 along the circumference of the first portion to cut away the first portion from the substrate. A corresponding opening is formed in the substrate 600. During the cutting operation, a laser beam 712 emanating from the processing device 710 may pass through the substrate 600 and through the opening 130. The laser beam 712 may not impinge on the support body 110. Damage to the support body 110 is avoided. After the cutting operation is completed, the piece that has been cut from the substrate 600 may fall through the opening 130.

An apparatus 700 according to embodiments described herein may include a control system. The control system may be configured or programmed for controlling a movement of a laser beam 712 emitted by the processing device 710. The control system may be configured for controlling a movement of the laser beam 712 such that the laser beam 712 impinges onto the substrate 600 in a portion of the substrate facing an opening 130 of the array of openings 130. The control system may be configured for controlling a movement of the laser beam such that the laser beam 712 does not impinge onto the support body 110. In light thereof, damage to the support body 110 can be prevented.

For example, with respect to FIG. 6, a laser beam emitted by the processing device may be controlled to move in regions inside the white rectangles representing the array of openings 130, and may be controlled not to impinge onto the hashed area representing the support body 110. In light thereof, the large openings 610 and the small openings 620 can be formed inside the periphery of the openings 130.

An apparatus 700 according to embodiments described herein may include a vacuum source arrangement 720. The one or more suction openings 140 may be in fluid communication with the vacuum source arrangement, particularly for chucking the substrate against the support body 110.

Figure 8A:
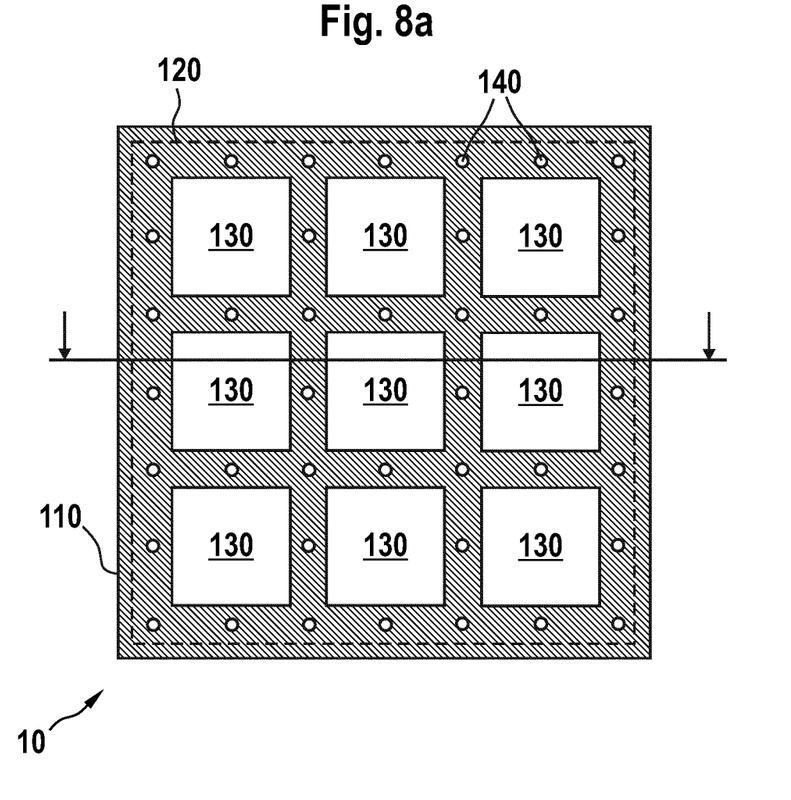
Figure 8B:
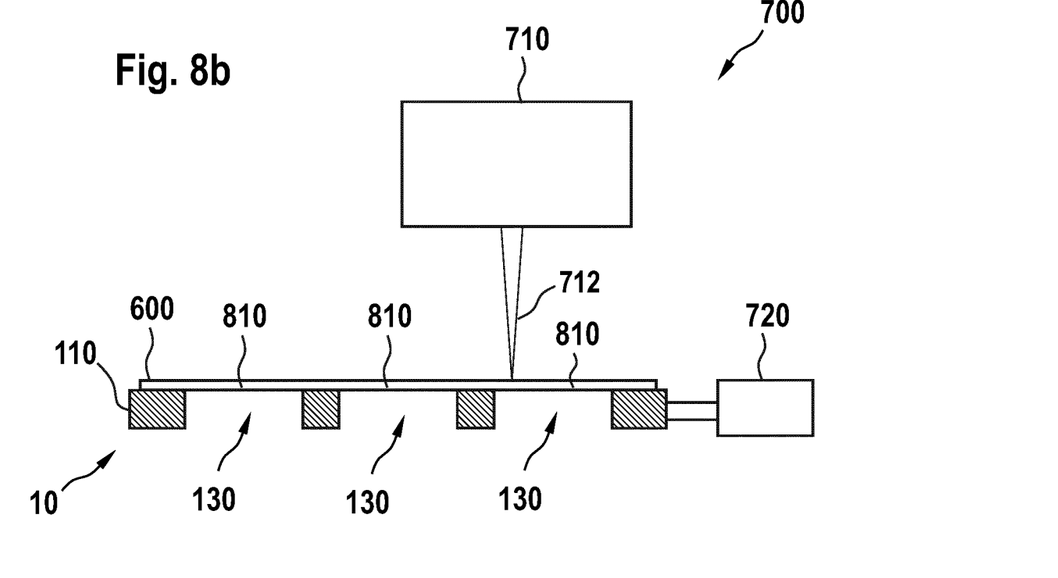

FIG. 8b shows a cross section of an apparatus 700 according to embodiments described herein in a side view. The cross section is taken along the line indicated in FIG. 8a.

The openings of the array of openings 130 can be through-holes of the support body 110. The substrate 600 is unsupported in regions facing the openings of the array of openings 130. Between adjacent openings of the array of openings 130, a portion of the support body supporting the substrate 600 is provided.

Figure 9A:
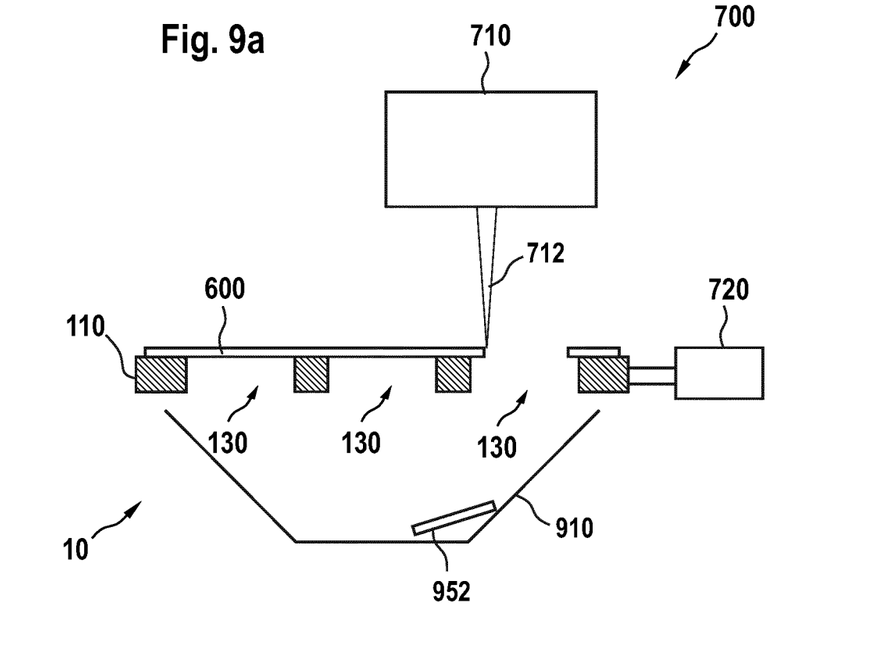
Figure 9B:
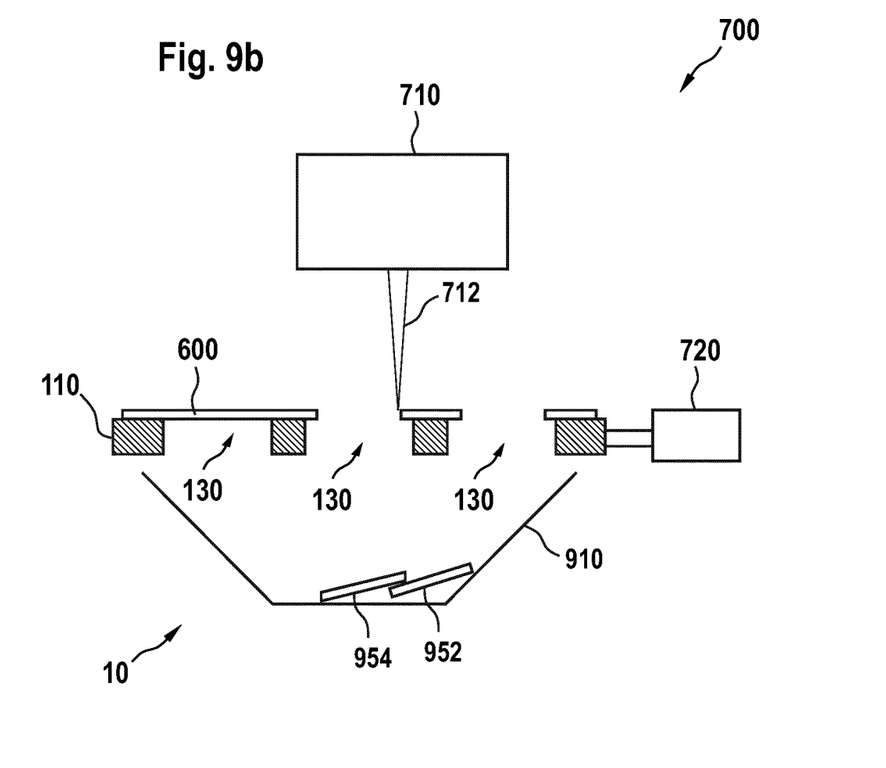

FIGS. 9a-b show an apparatus 700 according to embodiments described herein.

An apparatus 700 according to embodiments described herein can include a container 910. The container 910 can be arranged below the support body 110. The container 910 can be configured for receiving pieces of the substrate 600 that have been cut from the substrate 600 by the processing device 710. The container 910 can be configured for storing the pieces of the substrate 600.

FIG. 9a shows a first piece 952 of the substrate 600 that has fallen into the container 910 through one of the openings 130 after the first piece 952 has been cut from the substrate 600 by the processing device 710. FIG. 9b shows a second piece 954 of the substrate 600 that has fallen into the container 910 through another one of the openings 130 after the second piece 954 has been cut from the substrate 600 by the processing device 710.

Figure 10:
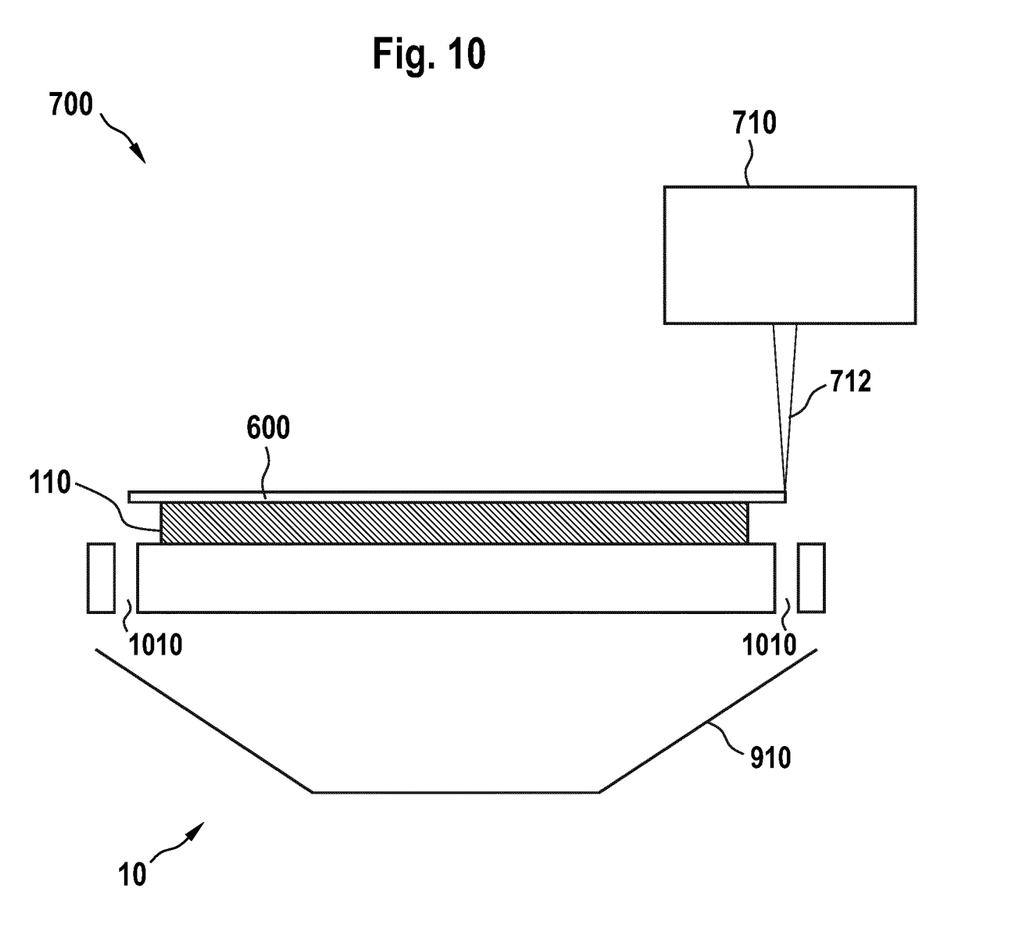
FIG. 10 shows an apparatus according to embodiments described herein, the apparatus including a groove for receiving pieces cut from the substrate.

FIG. 10 shows an apparatus 700 according to embodiments described herein.

A support body 110 according to embodiments described herein may be configured for receiving a substrate 600 which extends beyond the support body, as shown for example in FIG. 10. The substrate 600 may have an area which is larger than the area of the support body 110.

An apparatus 700 according to embodiments described herein may include one or more grooves 1010. The one or more grooves 1010 may be arranged below the support body 110. Each groove of the one or more grooves 1010 may be disposed under an edge region of the support body 110. The one or more grooves 1010 may be arranged for receiving pieces, particularly edge pieces, cut from the substrate 600 by the processing device 710. For example, the processing device 710 may be configured for cutting an edge piece from the substrate 600, e.g. a thin strip-like portion at one of the edges of the substrate. After the edge piece has been cut from the substrate 600, the edge piece may fall into a groove of the one or more grooves 1010. The edge piece may be received by the container 910.

A support device 10 according to embodiments described herein may be a replaceable support device. An apparatus 700 according to embodiments described herein may include a first support device according to embodiments described herein and a second support device according to embodiments described herein. The pattern formed by the array of openings 130 of the second support device may be different from the pattern formed by the array of openings 130 of the first support device. For example, the array of openings 130 of the second support device may have a different number of openings than the array of openings 130 of the first support device. In light thereof, a suitable support device can be selected, depending on the specific pattern of openings which is to be formed in the substrate.

According to a further embodiment, a method of processing a substrate 600 is provided. The method includes supporting a substrate 600 by a support body 110, wherein a plurality of portions of the substrate 600 having a joint area of 40% or more of the area of the substrate 600 are unsupported. For example, FIG. 8b shows a plurality of portions 810 of the substrate 600 which are unsupported. The method includes suctioning the substrate 600 to the support body 110 at one or more suction openings 140. The substrate 600, the support body 110, and the one or more suction openings 140 can be a substrate, a support body, and one or more suction openings, respectively, according to any of the aspects described herein.

An unsupported portion of the substrate 600, e.g. a portion 810 as shown in FIG. 8b, may be understood as a portion of the substrate 600 where the substrate 600 is not supported by, or in contact with, the support body 110 or other support component.

A plurality of unsupported portions of the substrate 600, as described herein, may be a plurality of unsupported portions or regions of the substrate 600 which are spaced apart from each other.

The plurality of unsupported portions of the substrate 600 may have a joint area of 40% or more, particularly 50% or more, 60% or more, 70% or more or even 80% or more, of the area of the substrate 600. The term "joint area", or "total area", may be understood as the sum of the areas of the individual unsupported portions of the substrate 600. If N portions of the substrate 600 are unsupported, the joint area of the unsupported portions can be understood as a sum of N individual areas, each individual area being the area of a corresponding unsupported portion of the substrate 600.

Each unsupported portion of the plurality of unsupported portions of the substrate 600 may have a first width in a first direction, wherein the first width is 5% or more of a first width of the substrate 600 in the first direction. Each unsupported portion of the plurality of unsupported portions of the substrate 600 may have a second width in a second direction, wherein the second width is 5% or more of a second width of the substrate in the second direction.

The plurality of unsupported portions of the substrate 600 may be disposed inside a periphery of a substrate receiving region as described herein. For example, the plurality of unsupported portions may be disposed inside the dashed lines 120 shown in FIG. 1.

The support body 110 may be shaped as a pattern having an array of openings 130 as described herein. Each opening of the array of openings 130 may correspond to, or face, an unsupported portion of the substrate 600.

The plurality of unsupported portions of the substrate 600 may be a two-dimensional array of unsupported portions.

One or more, particularly two or more, more particularly each, unsupported portion of the substrate 600 may be substantially rectangular portions of the substrate.

The plurality of unsupported portions of the substrate 600 may include a first unsupported portion and a second unsupported portion. The first unsupported portion may face a first opening of the array of openings 130 of the support body 110. The second unsupported portion may face a second opening of the array of openings 130 of the support body 110. The first opening and the second opening may be adjacent openings of the array of openings 130. The first unsupported portion may be spaced apart, or separated, from the second unsupported portion. The one or more suction openings 140, as described herein, may include at least one suction opening in between the first unsupported portion and the second unsupported portion.

The plurality of unsupported portions of the substrate 600 may include a third unsupported portion and/or a fourth unsupported portion. The third unsupported portion may face a third opening of the array of openings 130 of the support body 110. The third opening of the array of openings 130 may be adjacent to the second opening of the array of openings 130. The fourth unsupported portion may face a fourth opening of the array of openings 130 of the support body 110. The fourth opening of the array of openings 130 may be adjacent to the third opening and to the first opening of the array of openings 130. The one or more suction openings 140 may include at least one suction opening in between the second unsupported portion and the third unsupported portion. The one or more suction openings 140 may include at least one suction opening in between the third unsupported portion and the fourth unsupported portion. The one or more suction openings 140 may include at least one suction opening in between the fourth unsupported portion and the first unsupported portion.

One or more, particularly two or more, more particularly each, unsupported portion of the substrate 600 may be surrounded by a number of suction openings of the one or more suction openings 140, e.g. four, six, eight or more suction openings.

The one or more suction openings 140 may include a plurality of outer suction openings extending along an edge region of the substrate 600. Each unsupported portion of the plurality of unsupported portions of the substrate 600 may be surrounded by the plurality of outer suction openings.

The method according to embodiments described herein may include forming one or more openings in a first unsupported portion of the substrate 600. The one-or more openings may be through-holes. The first unsupported portion may face a first opening of the array of openings 130 of the support body 110. The one or more openings may be formed using a processing device 710 as described herein. Forming the one or more openings may include directing a laser beam onto the first unsupported portion of the substrate 600. The laser beam may cut through the first unsupported portion of the substrate 600. The laser beam may pass through the first opening of the array of openings 130 of the support body 110.

Forming the one or more openings in the first unsupported portion may include forming a plurality of openings in the first unsupported portion. The plurality of openings may include a large opening 610 and a plurality of small openings 620, or vias, surrounding the large opening 610.

The method according to embodiments described herein may include forming one or more openings, particularly through-holes, in a second unsupported portion of the substrate 600. The second unsupported portion may be spaced apart from the first unsupported portion. The second unsupported portion may face a second opening of the array of openings 130 of the support body 110.

The one or more openings in the second unsupported portion of the substrate 600 may be formed using a processing device 710 as described herein. Forming the one or more openings may include directing a laser beam onto the second unsupported portion of the substrate 600. The laser bean may cut through the second unsupported portion of the substrate 600. The laser beam may pass through the second opening of the array of openings 130 of the support body 110.

The method according to embodiments described herein may include forming one or more respective openings in each of 9 or more, 16 or more, or 25 or more unsupported portions of the substrate 600. The openings may be through-holes. Each of the unsupported portions may face a respective opening of the array of openings 130.

Embodiments of the method for processing a substrate 600 as described herein can be performed by a support device 10 and/or an apparatus 700 according to embodiments described herein.

According to a further embodiment, a semiconductor substrate is provided. The semiconductor substrate includes a two-dimensional array of openings, wherein a joint area of the openings of the two-dimensional array of openings is 40% or more of the area of the semiconductor substrate. The semiconductor substrate can be a substrate 600 as described herein, such as a substrate 600 shown in FIG. 6.

The joint area of the openings of the two-dimensional array of openings is 40% or more, particularly 50% or more, or even 60% or more, of the area of the semiconductor substrate. The notion of "joint area" for the two-dimensional array of openings of the substrate is analogous to the notion of "joint area" in respect of the array of openings 130 of the support body 110 as explained above.

The openings of the two-dimensional array of openings may be through-holes in the semiconductor substrate.

The semiconductor substrate can be a silicon substrate. Additionally or alternatively, the semiconductor substrate can be a semiconductor wafer. Additionally or alternatively, the semiconductor substrate can have a thickness of 150 μm or less, such as 120 μm or less or even 110 μm or less.

The two-dimensional array of openings in the semiconductor substrate may include a plurality of large openings 610, e.g. 20 or more, 50 or more, or 100 or more large openings. Each large opening may be a substantially rectangular opening.

The two-dimensional array of openings in the semiconductor substrate may include a plurality of small openings 620, e.g. 100 or more, 300 or more, or 800 or more small openings. The number of small openings may be larger than the number of large openings. A small opening may be understood as a via.

A small opening 620, as described herein, may have a diameter of 1% or less of a diameter of a large opening 610 as described herein.

Each large opening of the plurality of large openings may be surrounded by a number of small openings. For example, each large opening of the plurality of large openings may be surrounded by 50 or more, particularly 100 or more, small openings.

A linear array of small openings may be formed between any two adjacent large openings. Two large openings can be understood as being adjacent if there is no further large opening in between the two large openings.

The two-dimensional array of openings in the semiconductor substrate may extend in a first direction (e.g. the left-right direction in FIG. 6) and in a second direction (e.g. the up-down direction in FIG. 6). The two-dimensional array of openings can be understood as a matrix of openings.

The two-dimensional array of openings in the semiconductor substrate may include a plurality of rows of openings, each row extending in the first direction. Each row of openings may include a number of openings. Each row of openings may extend in the first direction from a first opening of the row to a last opening of the row. Each row may include 3 or more, particularly 9 or more, more particularly 20 or more, openings.

The two-dimensional array of openings in the semiconductor substrate may include a plurality of rows of openings, each row extending in the second direction. Each row of openings may include a number of openings. Each row of openings may extend in the second direction from a first opening of the row to a last opening of the row. Each row may include 3 or more, particularly 9 or more, more particularly 20 or more, openings.

The semiconductor substrate according to embodiments described herein can be manufactured using embodiments of the method, the support device and/or the apparatus described herein.

While the foregoing is directed to embodiments of the disclosure, other and further embodiments of the disclosure may be devised without departing from the basic scope thereof, and the scope thereof is determined by the claims that follow.

The invention claimed is:

1. An apparatus for processing a semiconductor substrate, comprising:
  a support device for supporting the semiconductor substrate, comprising:
  a substrate receiving region; and
  a support body shaped as a pattern having a two-dimensional array of openings, the support body being a sparse structure wherein a joint area of the openings of the two-dimensional array of openings is 40% or more of an area of the substrate receiving region,
  wherein the support body includes a plurality of suction openings configured to be in fluid communication with a vacuum source arrangement,
  wherein the two-dimensional array of openings of the support body includes a first opening and a second opening, wherein the first opening and the second opening are adjacent openings of the two-dimensional array of openings, wherein the plurality of suction openings includes at least one suction opening in a portion of the support body between the first opening and the second opening; and
  a laser device configured to form an opening through the semiconductor substrate, by emitting a laser beam on a portion of the semiconductor substrate facing an opening of the two-dimensional array of openings of the support body, wherein the laser beam moves inside a perimeter of the opening of the two-dimensional array of openings, so that the laser beam passes through the opening of the two-dimensional array of openings without impinging on the support body.

2. The apparatus according to claim 1, wherein each opening of the two-dimensional array of openings of the support body has a first width in a first direction, wherein the first width is 5% or more of a first width of the substrate receiving region in the first direction.

3. The apparatus according to claim 1, wherein each opening of the two-dimensional array of openings of the support body has a second width in a second direction, wherein the second width is 5% or more of a second width of the substrate receiving region in the second direction.

4. The apparatus according to claim 1, wherein at least one suction opening of the plurality of suction openings is provided in the support body between any two adjacent openings of the two-dimensional array of openings.

5. The apparatus according to claim 1, wherein the support body includes a support portion configured for supporting the semiconductor substrate between any two adjacent openings of the two-dimensional array of openings of the support body.

6. The apparatus according to claim 1, wherein each opening of the two-dimensional array of openings of the support body is surrounded by a number of suction openings of the plurality of suction openings.

7. The apparatus according to claim 1, wherein the support body includes a frame portion surrounding the two-dimensional array of openings of the support body.

8. The apparatus according to claim 7, wherein the plurality of suction openings includes one or more outer suction openings provided in the frame portion, the one or more outer suction openings surrounding the two-dimensional array of openings of the support body.

9. The apparatus according to claim 1, wherein the support body is shaped as a two-dimensional grid.

10. The apparatus according to claim 1, wherein the two-dimensional array of openings of the support body includes a third opening and a fourth opening, wherein the first opening, the second opening, the third opening and the fourth opening form a 2×2 matrix of openings, wherein:
the plurality of suction openings includes at least one suction opening in a portion of the support body between the second opening and the third opening;
the plurality of suction openings includes at least one suction opening in a portion of the support body between the third opening and the fourth opening; and
the plurality of suction openings includes at least one suction opening in a portion of the support body between the fourth opening and the first opening.

11. The apparatus according to claim 1, wherein the semiconductor substrate has a thickness of 150 μm or less.

12. An apparatus for processing a semiconductor substrate, comprising:
a support device for supporting the semiconductor substrate, comprising:
a grid-shaped support body having a two-dimensional array of openings; and
a plurality of suction openings in the grid-shaped support body,
wherein the two-dimensional array of openings of the grid-shaped support body includes a first opening and a second opening, wherein the first opening and the second opening are adjacent openings of the two-dimensional array of openings, wherein the plurality of suction openings includes at least one suction opening in a portion of the grid-shaped support body between the first opening and the second opening; and
a laser device configured to form an opening through the semiconductor substrate, by emitting a laser beam on a portion of the semiconductor substrate facing an opening of the two-dimensional array of openings of the grid-shaped support body, wherein the laser beam moves inside a perimeter of the opening of the two-dimensional array of openings, so that the laser beam passes through the opening of the two- dimensional array of openings without impinging on the grid-shaped support body.

13. A method of processing a semiconductor substrate, comprising:
supporting the semiconductor substrate by a grid-shaped support body having a two-dimensional array of openings, wherein a plurality of portions of the semiconductor substrate are unsupported;
suctioning the semiconductor substrate to the grid-shaped support body at a plurality of suction openings; and
forming an opening through the semiconductor substrate, by emitting a laser beam from a laser device onto an unsupported portion of the semiconductor substrate facing an opening of the two-dimensional array of openings of the grid-shaped support body, wherein the laser beam moves inside a perimeter of the opening of the two-dimensional array of openings, so that the laser beam passes through the opening of the two-dimensional array of openings without impinging on the grid-shaped support body; and
wherein a plurality of unsupported portions of the semiconductor substrate include a first unsupported portion facing a first opening of the two-dimensional array of openings of the grid-shaped support body and a second unsupported portion facing a second opening of the two-dimensional array of openings of the grid-shaped support body, wherein the first opening and the second opening are adjacent openings of the two-dimensional array of openings, wherein the plurality of suction openings includes at least one suction opening in between the first unsupported portion and the second unsupported portion.

14. The method of claim 13, further comprising:
forming one or more openings in at least one of the first unsupported portion and the second unsupported portion of the semiconductor substrate.

15. The method according to claim 13, wherein the semiconductor substrate has a thickness of 150 μm or less.

* * * * *